United States Patent [19]

Frederiksen

[11] Patent Number: 4,922,537
[45] Date of Patent: May 1, 1990

[54] METHOD AND APPARATUS EMPLOYING AUDIO FREQUENCY OFFSET EXTRACTION AND FLOATING-POINT CONVERSION FOR DIGITALLY ENCODING AND DECODING HIGH-FIDELITY AUDIO SIGNALS

[75] Inventor: Jeffery E. Frederiksen, Arlington Heights, Ill.

[73] Assignee: Frederiksen & Shu Laboratories, Inc., Arlington Heights, Ill.

[21] Appl. No.: 57,370

[22] Filed: Jun. 2, 1987

[51] Int. Cl.⁵ ................................................ G10L 5/00
[52] U.S. Cl. ........................................ 381/31; 381/34; 375/122
[58] Field of Search .............................. 381/30, 31–36, 381/106; 375/122; 340/347 DD

[56] References Cited

U.S. PATENT DOCUMENTS 4,295,223 10/1981 Shutterly ............................... 455/72
4,550,425 10/1985 Andersen et al. ..................... 381/34

OTHER PUBLICATIONS

F. Mazada (editor), *Electronics Engineer's Reference Book*, 5th ed., Butterworths, Boston, Mass., (1983), pp. 51/6–9, 54/21–22, 56/18–23.
A. Oppenheim (editor), *Applications of Digital Signal Processing*, Prentice-Hall, Englewood Cliffs, NJ, (1978), pp. 6–7, 38–41.
Caine et al., "NICAM-3", The Radio and Electronic Engineer, 50, No. 10, pp. 519–530, Oct. 1980.

*Primary Examiner*—Emanuel S. Kemeny
*Attorney, Agent, or Firm*—Arnold, White & Durkee

[57] ABSTRACT

An audio signal is initially represented by a series of high-resolution pulse code modulated (PCM) data. A lower rate series of representative values are extracted from the initial series of PCM data. Half of the lower rate is at an intermediate audio frequency so that the lower rate series encodes low frequency components of the audio signal. The PCM data are adjusted by offsetting in accordance with corresponding representative values and are then converted to a floating-point representation by extracting scale factor or exponents. The combination of the series of representative values and the floating-point data provides a rate-compressed representation of the audio signal which is capable of being decoded after transmission or storage to reproduce the audio signal without substantial noise, distortion or loss of dynamic range. The splitting of the audio information between the lower rate series and the adjusted floating-point PCM limits the normally destructive effect that low frequency components of high amplitude have upon high frequency components of relatively low amplitude. In a preferred embodiment, a common offset is determined for each block by computing the arithmetic mean of the maximum and minimum PCM data values for the block and truncating the result, the PCM data are adjusted by subtracting their corresponding common offsets, and a common exponent is determined for the block of adjusted PCM data. For encoding high-fidelity audio, preferably the audio signal is initially represented by a series of 16-bit PCM samples at a rate of at least 36 kilohertz, the block size is chosen to be 16 audio samples, and the encoded and pg,2 compressed data for each block includes a 160 bit frame consisting of an 8-bit block offset, a 3-bit block exponent, a 5-bit error correction code, and sixteen floating-point values each including eight data bits and one parity bit. This format permits 9 stereo audio channels and frame synchronization to be readily transmitted over a conventional video channel.

46 Claims, 6 Drawing Sheets

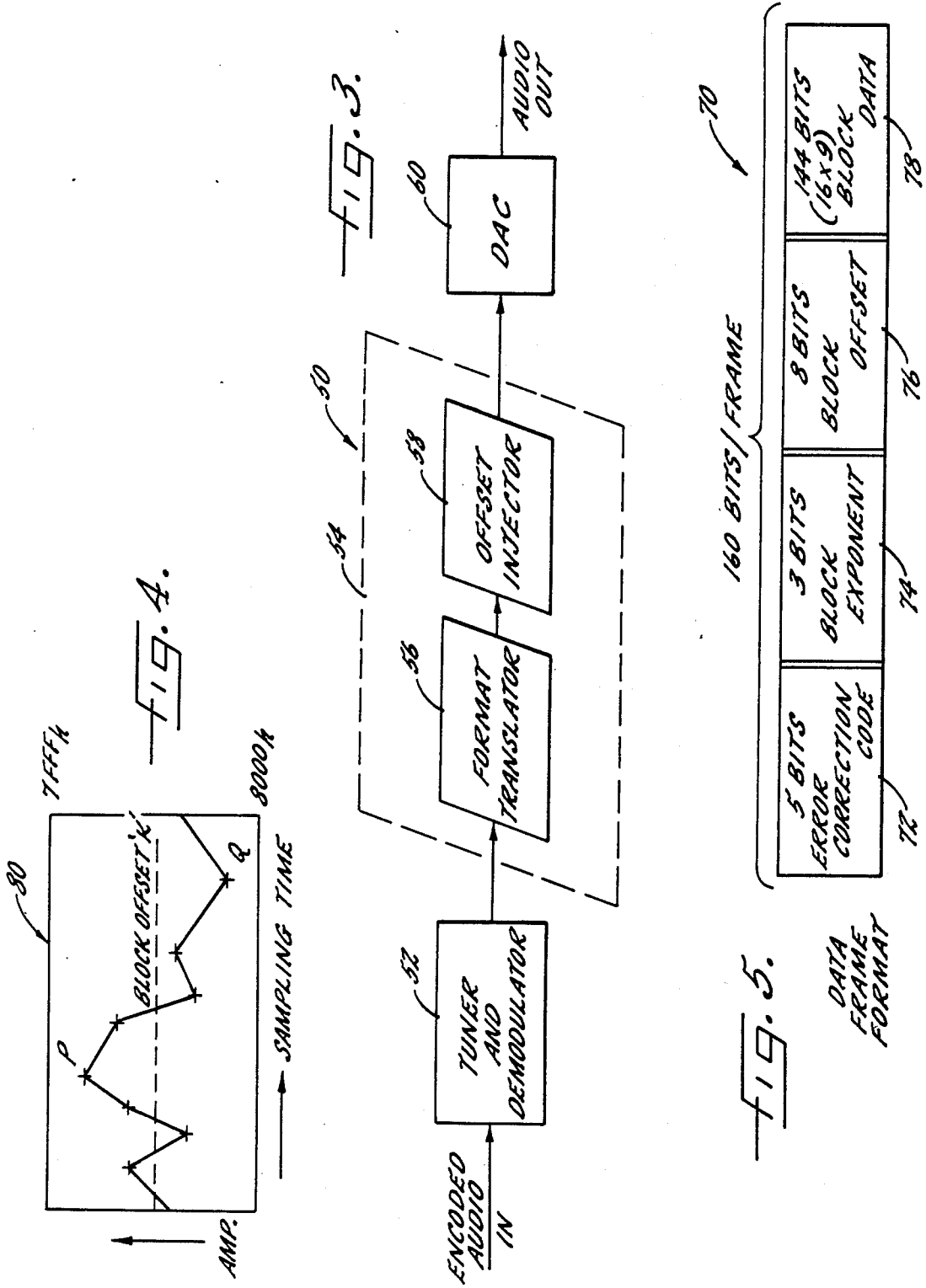

METHOD AND APPARATUS EMPLOYING AUDIO FREQUENCY OFFSET EXTRACTION AND FLOATING-POINT CONVERSION FOR DIGITALLY ENCODING AND DECODING HIGH-FIDELITY AUDIO SIGNALS

FIELD OF INVENTION

This invention generally relates to digital techniques for the representation, transmission and reproduction of audio signals. More particularly, this invention relates to digital audio signal processing systems which use companding techniques in connection with encoding, recording, transmitting or decoding broadcast-quality audio signals.

BACKGROUND OF THE INVENTION

The use of multi-channel digital circuits for the transmission of audio signals in becoming increasingly common because of a variety of associated advantages, including simplicity, convenience and economy. Digitally encoded audio signals are easily multiplexed and demultiplexed, and error detecting or correcting codes are readily employed for noise immunity. Multichannel PCM (pulse code modulation) systems, for example, have been developed for carrying stereo program material between studio centers and main transmitters. Such a system, transmitting 13 audio channels over a line designed for carrying a standard television signal, is described in F. Mazada (editor), *Electronics Engineer's Reference Book*, 5th ed., Butterworths, Boston, Mass., (1983), pp. 54/21–54/22.

Digital techniques have also been applied to overcome the problems that commonly hinder the transmission and reproduction of high quality sound. By employing 16-bit pulse-code modulation at a sampling rate of at least 36 kHz, it is possible to record or transmit a high-fidelity audio signal with virtually no perceptible noise or distortion. Compact digital discs (CDs) carrying pre-recorded stereo audio signals in such a PCM format at a 44.1 kHz sampling rate are now in widespread use along with CD players.

A typical problem with audio transmission is that the signal-to-noise ratio varies with the amplitude of the audio signal. For speech transmission in particular, the noise may become obtrusive during gaps between syllables. It is conventional to overcome this problem by the process of companding, which involves the compression of the amplitude variations in the audio signal before transmission, and expansion of the received signal after detection at the receiver. Companding permits efficient transmission of audio signals by effectively varying the noise level depending on the signal level, the noise being least at the lowest signal levels and highest at maximum signal levels.

Companding is readily performed with digital circuits, and is useful for bandwidth compression as well as for concealing background noise. A typical digital system employing companding is the NICAM-3 developed by the BBC ("NICAM-3," *The Radio and Electronic Engineer*, 50, No. 10, pp. 519–530, Oct 1980). The NICAM-3 system uses nearly instantaneous companding in which the system periodically samples an audio signal and initially codes the samples to 14-bit accuracy by performing analog-to-digital conversion. The NIcAM system further encodes the digitized samples by using a set of four linear coding scales having maximum amplitudes in six-dB steps. The samples are processed in blocks of sixteen consecutive samples, and the amplitude of the largest sample in each block is used to determine which of the available coding scales is used for the block. The chosen scale is the lowest of the four scales which can completely accommodate the largest sample. Since each of the linear scales has a 10-bit resolution, the encoded samples undergo a digital compression from 14 bits per sample to 10 bits per sample. Decoding of the transmitted data is accomplished by including a data channel multiplexed with the original data stream in order to indicate to the receiver which scale is to be selected to decode each block of received samples.

The NICAM-3 system uses what is generally known as "floating-point PCM". As described in A. Oppenheim (editor), *Applications of Digital Signal Processing*, Prentice-Hall, Englewood Cliffs, N.J. (1978), pp. 38–41, the control of the coding scale factor for floating-point PCM can also be "instantaneous" or "syllabic". When it is instantaneous, the scale factor is determined for each sample. When it is syllabic, the scale factor is decreased whenever the converter would have been overloaded, but it is not increased until after the signal has remained below half-scale for a predetermined waiting period. Typical waiting periods are on the order of 100 to 300 milliseconds.

A near-instantaneous companding method similar to floating-point PCM is disclosed in Shutterly U.S. Pat. No. 4,295,223. For companding the audio portion of a television signal, a common scale factor is selected for each TV field. The common scale factor is either 1, 2, 4, 9, 16 or 32, and the largest one of these is selected which does not cause the companded audio signal to exceed the peak signal limits. A three-bit code is transmitted in the vertical retrace interval of each field in order to indicate the selected scale factor. For companding in a scrambler, the audio signal is converted to PCM samples, the scale factor is selected based on the values of the samples, and the samples are multiplied by the scale factor. The companded samples are fed to a digital-to-analog converter for generating an analog sample for each companded sample. Each analog sample is inserted as a pulse into a corresponding line of the video signal. The scrambler transmits the video signal to at least one descrambler where an analog-to-digital converter converts the analog samples to corresponding digital values. The digital values are divided by the scale factor indicated by the three-bit code. The digital values obtained at the descrambler might not be equal to their corresponding values at the scrambler due to bias shift between the scrambler and descrambler converters. To compensate for any bias shift, a preselected mid-range level from the digital-to-analog converter is transmitted as an analog pulse in each field of the video signal. (The mid-range level is said to be set to the mean of the upper and lower limits of the analog samples.) The mid-range pulse is received by the descrambler and converted to a corresponding value for removing the effect of any bias shift from the digital values prior to division by the scale factor.

Floating-point PCM allows a increased number of audio channels to be transmitted for a system of given bit capacity by virtue of the reduced bit rate resulting from the digital compression. However, such systems are susceptible to problems stemming from the fact that audio energy in typical audio broadcasts tends to be concentrated at the lower frequencies. The non-uniform energy distribution across the frequency spectrum may cause undue distortion of the upper frequency signals at the receiver end.

It is common to combat this problem by providing pre-emphasis before transmission followed by de-emphasis at the reception end. The higher audio frequencies are given greater amplification than the lower audio frequencies before transmission in order to achieve a more uniform distribution of energy, and the receiver end is given a reverse amplification frequency response in order to restore the original energy distribution. This process leads to an improved signal-to-noise ratio since the received noise content is reduced while the high audio frequencies are reduced in amplitude. However, the degree of improvement that can be achieved by the use of pre-emphasis/de-emphasis techniques is limited by the requirement of achieving a wide dynamic range and a uniform amplitude response over the audio spectrum.

SUMMARY OF THE INVENTION

Accordingly, a primary object of the invention is to provide an improved method for digitally encoding, rate compressing and decoding stereo broadcast quality audio signals.

A related object of the invention is to provide such an improved digital encoding, rate compressing and decoding method which does not produce significant distortion of upper frequency signals as a result of non-uniform energy distribution across the frequency spectrum.

A further object of the invention is to provide a digital recording or transmission system for stereo broadcast quality audio signals which has a wide dynamic range, uniform amplitude response, and enhanced noise immunity.

A further object of the invention is to provide an improved audio transmission system which is particularly applicable to the transmission of several digitally sampled stereo audio signals over a conventional cable television channel. A related object of the invention is to provide such an improved audio transmission system which uses a decoder that is economical to mass produce.

Briefly, in accordance with the invention, an audio signal represented by a series of high-resolution pulse code modulated (PCM) data at a predetermined rate is compressed by extracting a lower rate series of representative values. The PCM data are adjusted by offsetting in accordance with corresponding representative values, and the adjusted PCM data are then converted to a floating-point representation by extracting scale facto or exponents. The combination of the series of representative values and the floating-point data provides a rate-compressed representation of the audio signal which is capable of being decoded after transmission or storage to reproduce the audio signal without substantial noise, distortion or loss of dynamic range.

According to a preferred embodiment of the invention, a digital audio transmission system accepts a stereo audio signal in the form of 16-bit pulse code modulated (PCM) data. An encoder converts the PCM data to a pseudo-floating-point format which is then transmitted over a transmission link to the end user. At the user end, a decoder reconstructs the received data into a 16-bit PCM format in order to yield the originally encoded stereo audio signal.

The pseudo-floating-point conversion performed by the encoder preferably compresses the PCM data fed to it by processing the data in blocks, each of which consists of a plurality of samples. The sample values obtained for each block are centered about a zero reference level by extracting and subtracting a common offset value so that data within a block extend over an equally distributed range. Since the centering process is performed before conversion of the PCM data to the pseudo-floating-point format, any large common offset for the block, such as is typically caused by a high amplitude low frequency audio signal, is substantially eliminated prior to conversion. This centering process limits the normally destructive effect that low frequency signals of a high amplitude have upon high frequency signals of relatively low amplitude. The audio frequency below which cancellation occurs is preselected by preselecting the number of samples within a sample block. Moreover, since the offset for each block is transmitted to the decoder, the low frequency component of the audio signal is always represented by a relatively high degree of precision.

A binary exponent of the pseudo floating-point representation for a given block is chosen in accordance with the largest absolute magnitude found among all samples within a block after the centering process. In particular, the exponent is selected so that the largest sample is representable in floating-point representation with the maximum amount of precision.

Preferably a few bits of error correction data are included in the pseudo-floating-point format to protect the integrity of the binary exponent and the common offset value for each block and thereby insure proper decoding, even if there is substantial noise in the transmission channel. Preferably a parity bit is provided for each floating-point value for noise protection in the usual manner.

DESCRIPTION OF THE DRAWINGS

The invention and other objects and advantages thereof may best be understood by referring to the following description along with the accompanying drawings in which:

FIG. 3 is a block diagram representation of a decoder for one audio channel of the audio transmission system according to the invention;

FIG. 4 is a graphical schematic representation of variation in amplitude of samples within a selected data block with respect to sampling time for illustrating the extraction of the block offset according to the invention;

FIG. 5 is a representation showing in detail the data frame format for a given data block according to the preferred embodiment of the invention;

DESCRIPTION OF THE PREFERRED EMBODIMENT

While the invention will be described in connection with certain preferred embodiments, it will be understood that it is not intended to limit the invention to those particular embodiments. On the contrary, it is intended to cover all alternatives, modifications and equivalent arrangements as may be included within the scope of the invention as defined by the appended claims.

Figure 1:
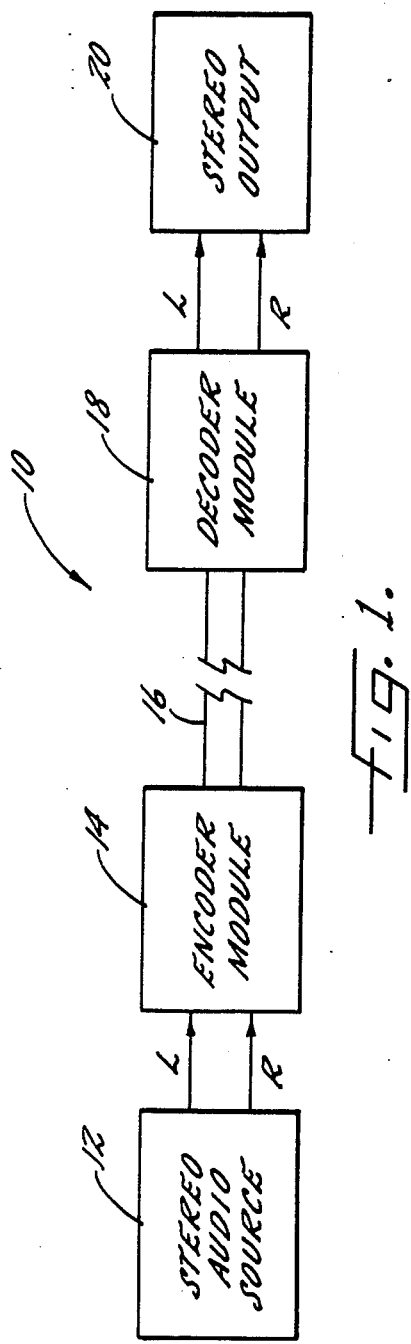
FIG. 1 is a simplified block diagram illustrating the audio transmission system of the invention.

Referring now to the drawings and specifically to FIG. 1, there is shown in simplified block diagram forms a stereo audio signal transmission system embodying the present invention.

The audio encoding and transmission system 10 is shown subdivided into its most basic components. An audio signal source 12 supplies audio signals to an encoder module 14 for encoding prior to transmission. The audio source 12, for instance, supplies dual audio channels (left and right) of a stereo broadcast video channel to the encoder module 14. The encoder module 14 samples the stereo audio signals, converts the samples to digital form, and further encodes the samples in a compression process which, for instance, allows an increased number of audio channels to be fit within a single video broadcast channel.

As a prelude to the encoding procedure, the signal in each audio channel is converted into 16-bit pulse code modulated (PCM) data. During encoding, the PCM data are converted into a pseudo-floating-point format, through a compression process which processes the PCM data in the form of a series of blocks each consisting of a predetermined number of consecutive samples. In this process the data for each block are adjusted by a common offset value which is calculated as the mean value of the maximum and minimum sample values in the block, so that the adjusted data are evenly distributed or centered within a certain range for floating-point representation. The preferred encoding scheme and the details involved therein will be described in detail below.

Encoded data from the encoder module 14 are transmitted over a conventional broadcast link 16 such as a cable link for linking together a plurality of subscribers to a cable television channel. The transmitted encoded data are received by a decoder module 18 which converts the pseudo-floating-point representation of the encoded data back to the PcM format. For reconstructing the stereo audio signals, the PCM data for the left and right stereo channels are fed to separate digital-to-analog converters. Finally, the stereo audio signals from the decoder provide stereo output 20 which, for example, is reproduced by a conventional stereo high-fidelity amplifier with speakers.

Figure 2:
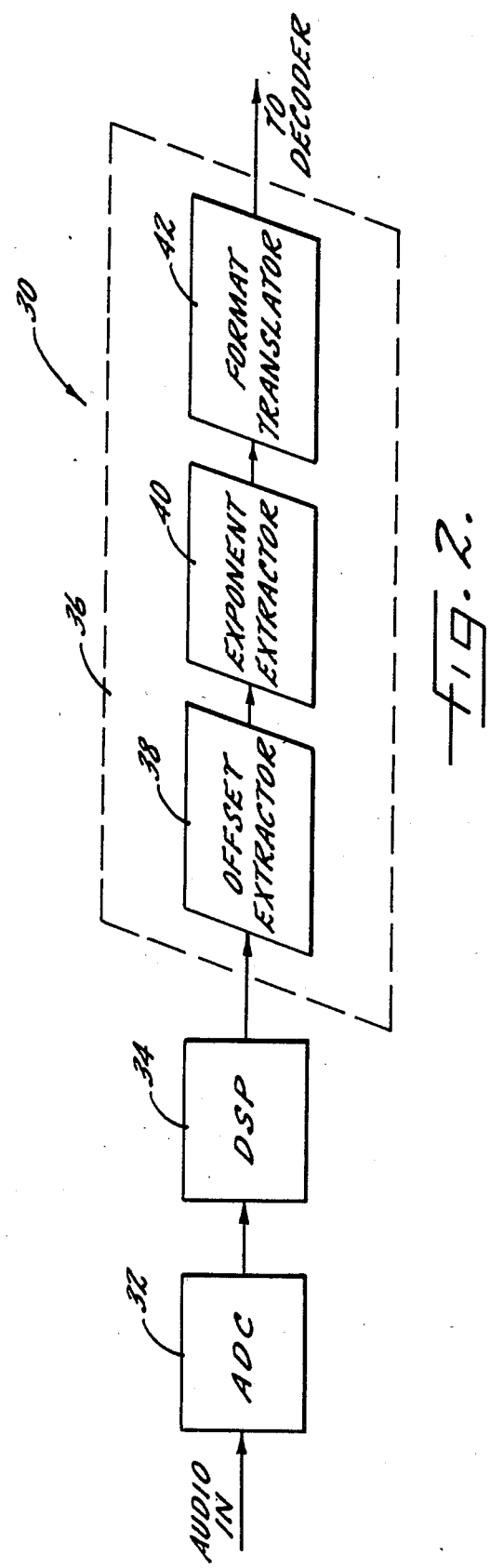
FIG. 2 is a block diagram representation of an encoder for one audio channel of the audio transmission system of FIG. 1.

Referring now to FIG. 2, there is shown a more detailed block diagram of a single audio channel 30 of the encoder module (14 in FIG. 1) for use with the system of FIG. 1. It should be understood, therefore, that the encoder module 14 of FIG. 1 includes two of the channels as shown in FIG. 2 for encoding the stereo signals. Audio signals are received through an analog-to-digital converter (ADC) 32 which samples the analog signals and converts them into corresponding digital values. For using the encoder in a cable television channel network, the ADC 32 is fed directly from the audio channel corresponding to a particular video channel to be transmitted. According to the illustrative embodiment for cable television, the ADC samples the audio-signals at a periodic rate of 56.8 kHz and provides 16-bit PCM values.

The sampled 16-bit PCM data from the ADC 32 are fed to a digital signal processor DSP 34 which essentially performs a low-pass filtering operation upon the digitized audio signals along with a decimation/interpolation operation which brings about a desired sampling frequency change. The DSP changes the original sampling frequency to a lower frequency which preferably is most compatible with the video chrominance frequency components associated with the video channel with which the processed audio is to be broadcast. Specifically, the DSP brings about a change in the ADC sampling frequency from 56.8 kHz to 37.879 kHz. The low-pass filtering operation performed by the DSP 34 is selected to have good stop-band rejection qualities to reject frequencies above 18.939 kHz since a change of sampling frequency requires the removal of all "image" energy from the input audio signal to prevent non-linear "aliasing" distortion. This allows the encoding and transmission of the full audio bandwidth associated with cable television channels (which generally is 18 kHz). The low-pass filtering performed by the DSP ensures that no image signal energy is included within the pass band of the filtering operation and hence the associated non-linear distortion is avoided.

It should be noted that the ADC 32 followed by the DSP 34 is a preferred alternative to an anti-aliasing analog low-pass filter followed by an analog-to-digital converter sampling at the 37.879 kHz rate, since the digital low-pass filtering provided by the DSP can be superior to that of an analog low-pass filter. The ADC-DSP technique for analog-to-digital conversion is further described in A. Oppenheimer, *Applications of Digital Signal Processing*, Prentice-Hall, Englewood Cliffs, N.J. (1978) pp. 6–7.

Compact audio discs (CDs) could also be used as a source of 16-bit PCM audio data. Standard CDs provide 16-bit PCM data at a rate of about 44.1 kHz. For providing a source of a plurality of stereo audio signals, a number of CD player units could be used with their time base oscillators wired together to provide synchronized PCM data.

The 16-bit PCM data from the audio source is provided to an encoder 30. The encoder converts the PCM data fed to it into a pseudo-floating-point representation before transmitting the data by using one of the many conventional data transmission techniques, such as raised cosine pulse shaping. The transmission and reception of multi-channel PCM data over a television channel using such a conventional transmission technique is further described in F. Mazda (editor), *Electronics Engineer's Reference Book*, 5th ed., Butterworths, Boston Mass. (1983), pp. 54/21 to 54/22. Actual transmission is performed via amplitude modulation (AM) over the transmission link to the subscriber.

According to a feature of this invention, compression of the PCM data is obtained by processing it in the form of blocks, each containing a plurality of samples. A common offset value "K" and a common floating-point exponent is determined for each block. The preferred embodiment uses blocks consisting of 16 audio samples.

In order to prevent any large common offset in the 16-bit PCM data for each block from being included in the floating-point representation, the sampled values for each of the sample blocks are centered by extracting the common offset value K. More specifically, the offset value K is calculated as the median value between the maximum value and the minimum value found within the sample block. Subsequently, the offset value K is subtracted from each of the 16 samples in the block in order to effectively center the samples about a zero reference level. At this stage, the block data extend over an equally distributed range from the maximum value to the minimum value.

The extraction of the common offset is performed within the encoder module 36 by an offset extractor 38 and increases the effective resolution of the encoding procedure by preventing large low frequency signals from overriding any low amplitude high frequency signals. The offset extraction forms an important feature of this invention and directly contributes to the non-destructive characteristics of the illustrative encoding procedure, as described below.

The number of samples within a block to be encoded determines the extent of cancellation of distorting low frequency components produced by the encoding procedure. Specifically, the centering procedure functions as a single pole high-pass filter with a cut-off frequency equal to the Nyquist frequency divided by the number of samples per block. For the above-mentioned sampling frequency of 37.879 kHz, the Nyquist frequency is 18.939 kHz. Therefore, for 16 samples per block, the cut-off frequency is 1.184 kHz. In other words, the centering procedure cancels a 1.184 kHz signal component by a factor of 3 dB. The cancellation factor increases for lower frequency components and almost total cancellation (by more than 20 dB) occurs for low frequency components having frequencies of 100 Hz or less. Although the low frequency components are removed prior to companding, they are encoded separately in the offsets and are replaced during the decoding process. The extraction of the common offsets hence provides the encoding procedure with a relative independence between audio signals of extremely low and extremely high frequency without any loss of precision that would be associated with a filtering operation.

Returning now to FIG. 2, after the common offset is extracted from the 16-bit PCM data for a given sample block, all samples within the block are effectively centered. Floating-point representation of the centered samples within the block is then obtained on the basis of the largest absolute sample magnitude found within the block after centering. This largest sample value is truncated from its 16-bit value to an 8-bit value after left-justification, if possible, by up to 7 binary places. The number of possible binary places for left-justification indicates the common binary exponent for the block. This process is performed by the exponent extractor 40 within the encoder module 36. As is apparent, a significant degree of data compression is obtained since a 16-bit sample is represented only by an 8-bit value and the corresponding common binary component for the block. In the illustrative embodiment the common binary component is a 3-bit value. Subsequently, the encoder module performs the actual format translation from the 16-bit PCM to a corresponding pseudo-floating-point representation through a format translator 42 by effectively left-shifting all of the centered 16-bit PCM values by a number of places specified by the exponent and truncating to eight bits per value. Finally, the encoded data is transmitted over the transmission link (16 in FIG. 1).

The encoded data can be transmitted in any convenient form. Although the offsets and the exponents are preferably transmitted in digital form to ensure virtually error free transmission, the floating-point values do not require as much error protection as the offsets and exponents. The floating-point values, for example, could be transmitted as analog pulses (as in Shutterly U.S. Pat. No. 4,295,223) or as an analog waveform or waveform segments. If analog waveform segments are transmitted, the beginning and ending portions should be extended (so that the first portion of a following segment must repeat the last portion of a preceding segment) since the extreme beginning and ending portions become slightly distorted due to band-limiting effects and therefore should not be used for conveying values.

Referring now to FIG. 3, there is shown a block diagram of one audio channel 50 of the decoder module (18 in FIG 1). For use in a cable television system, a tuner and demodulator 52 accepts the transmitted encoded data and demodulates it before presenting it to a decoder 54. The decoder includes a format translator 56 which functions to reconvert the audio signals from their pseudo-floating-point representation (as produced at the encoding stage) back to fixed-point representation. The fixed-point data is next processed by an offset injector 58 which combines the fixed-point data with the corresponding block offsets in order to obtain the complete audio data representation for a given sample block. The decoded output signals of the decoder module 54 are then passed on to a digital-to-analog converter 60 which translates the digital values into corresponding analog signals which are used to generate an audible output by interfacing with the subscriber equipment (e.g. a stereo hi-fi amplifier and speakers) at the decoder end.

Referring now to FIG. 4, there is shown a graphical representation 80 of the variation in quantization amplitude of samples within a sample block with respect to sampling time. The samples can possibly range from a negative value of 8000 (HEX) to a positive value of 7FFF (HEX). (Signed integer representation is used as a matter of convenience; for example, if the original PCM samples range from 0000 (HEX) to FFFF (HEX), a value of 8000 (HEX) can be added to each of the original PCM samples to convert to signed integer representation.) As introduced above, the PCM data at the input of the encoder is processed in sample blocks consisting of 16 samples each and, as shown, the common value K is determined as the median value between the maximum value P and the minimum value Q within the block. The median or common offset value K is then subtracted from the value of each sample within the block so that each of the 16 samples within the block is at this stage centered about the value K, so that the audio data extend over an equally distributed range from the maximum value P to the minimum value Q. Since the block centering procedure occurs before conversion to the floating-point format, the above scheme prevents the floating-point representation from including any large common offsets as is typically caused by large amplitude, low frequency signals.

After offset extraction, which results in each of the samples within the block being centered about a zero reference level, the normalized sample having the largest absolute magnitude within the 16 samples in a block is used as the basis for determining the common 3-bit binary exponent for the pseudo-floating-point representation of the block. In effect, the encoding system of this invention employs eight ranges to compress from 16 to 8 bits, and the selection of a particular range is made by examining the 8 most significant bits of each sample and determining a 3-bit binary exponent which best indicates the highest range required by each group of 16 samples. In numerical terms, the exponent is indicated by the number of binary places, up to a maximum of 7, that the 16-bit normalized data can be left-shifted without overflow.

Data compression is obtained as part of the conversion to the floating point representation for a sample block by means of a shift operation upon the 16-bit value representing the magnitude of each sample. The binary exponent for each group of 16 samples provides an indication of which 8 bits of each 16-bit sample value are to be discarded by controlling the shift operation in such a way that the desired number of bits are deleted from appropriate positions within each 16-bit sample value.

Due to the compression effect of the encoding process, the precision of the floating-point representation is relatively independent of the low-frequency signal amplitude and increases with decreased high-frequency signal amplitude. Samples having centered values that are higher in level than half the maximum permissible peak amplitude are coded to a precision of 8 bits. On the other hand, if all samples in a block have centered values that are less than 1/128th of the maximum allowable peak amplitude, coding accuracy is retained at the maximum possible resolution of 16 bits per sample.

At the decoder end, an inverse operation is performed. After demodulation, the decoder module is loaded sequentially with the 8-bit value representing the magnitude of each compressed sample. The 3-bit binary exponent is then used to perform in effect an arithmetic right-shift operation by the number of binary places indicated by the exponent to reproduce substantially the original 16-bit magnitude of a sample.

The fixed-point to floating-point conversion procedure is better understood by considering a numerical example. For instance, consider the case where the largest value of all the centered samples within the 16-sample block is 3CFA (HEX). This value is normalized by a shift operation in the left direction by one position resulting in a value of 79F4 (HEX) which represents the largest positive value that can be contained in a predetermined positive limit of 7FFF (HEX). The truncation process thereby yields an 8-bit number represented by the value 79 (HEX). The binary exponent value is set to −1, since one left shift was used. The truncated representation, when converted back to 16-bit PCM format at the decoder, of 3D00 (HEX).

By following the above procedure, a given block of 16 data points can be expressed by a common 8-bit offset value K, a common 3-bit binary integer exponent having a value of zero to 7 for representing the magnitude of the exponent, and an 8-bit data value for each of the samples within the block. This is illustrated clearly in FIG. 5 which is a representation of the data frame format for a sample block consisting of 16 audio samples. The data format includes a 5-bit error correction code for the offset K and the binary exponent, the 3-bit binary exponent for the block, the 8-bit offset value K, and the 9-bit data values for each of the 16 samples within the block. Each of the 9-bit data values comprises 8 bits of data for the sample along with an added bit for parity checks. As is conventional, the decoder uses the parity check to isolate erroneous data values and replace each erroneous value by either the previous value or an interpolated value.

The representation shown in FIG. 5 requires a total of just 160 bits in order to represent every block of 16 audio samples. More specifically, the chrominance frequency associated with conventional cable television system is 3.579545 mHz and this is used by the encoding system to generate a transmission baud rate having a value of twice the chrominance carrier frequency or 7.159090 megabaud. The chosen baud rate when divided by the selected changed sampling frequency yields the corresponding bit rate for the transmission system. The choice of the sampling frequency of 37.879 kHz along with the 7.16 megabaud rate yields a data bit rate of 189 for a single sampling interval, and correspondingly allows the transmission of 3024 bits in the 16 sampling intervals of the selected 16 sample block. Hence, upon the basis of the transmission baud rate described above, a single television channel possessing a bit capacity of 3024 bits spread over the 16 sampling intervals can accommodate up to 18.9 channels (3024÷160=18.9 channels).

In effect, the representation of FIG. 5 permits the transmission of nine stereo audio channels over a single video channel along with the provision of a partial channel for additional information, such as a frame synchronization code and housekeeping data. The audio data is compressed from the original 16 bits for each of the 16 samples within a block, i.e., an original total of 256 bits, to a compressed total of 139 bits including the 3-bit binary exponent, the 8-bit offset K value and bits for each of the 16 samples for the sample block. The overall compression ratio obtained is hence 1.8417.

Figure 6:
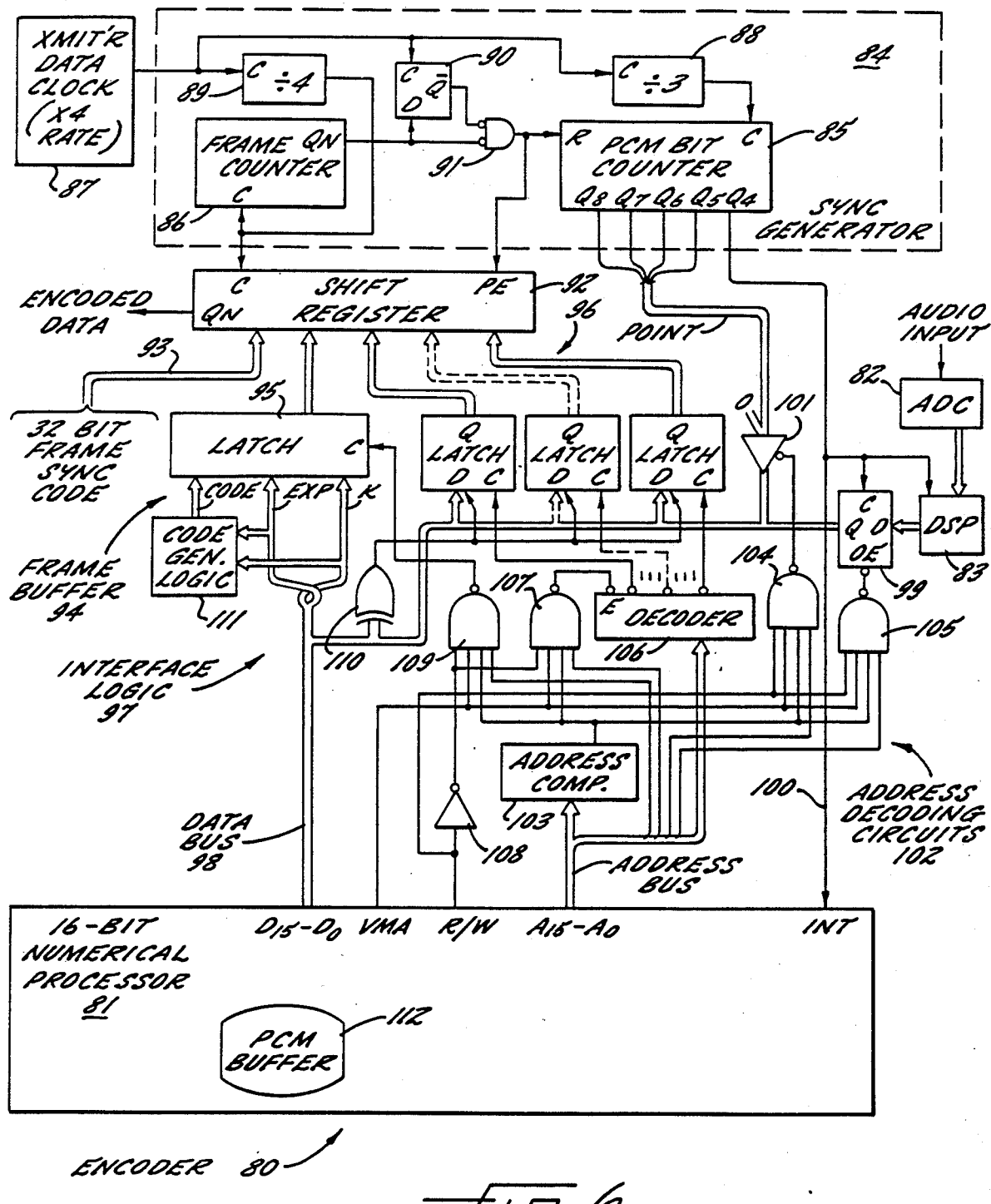
FIG. 6 is a schematic diagram of a specific embodiment of an encoder according to the invention which uses a numerical processor.

Turning now to FIG. 6, there is shown a specific embodiment of an encoder for encoding audio data in the compressed format of FIG. 5. The encoder, generally designated 80, includes a 16-bit numerical processor 81 for performing the computations and comparisons required for the encoding process. The processor 81 operates on a periodic or interrupt basis to process in real time each audio sample provided by an analog-to-digital converter ADC 82 and a digital signal processor DSP 83 operating in the fashion previously described.

Due to the compression process, the encoded data rate is different from the sampling rate provided by the ADC 82 and the DSP 83. These rates, however, must be precisely related to each other according to the ratio of the number of audio samples processed per frame (for example 16) to the number of encoded data bits per frame (for example, 160 as shown in FIG. 5). In order to synchronize the audio sampling with the transmission of the encoded data, the encoder 80 includes a sync generator 84 including a PCM bit counter 85 counting at the PCM bit rate and the audio sampling rate, and a frame counter 86 counting the transmitted bits as they are transmitted. To insure proper synchronization of the sampling, encoding and transmitting process, the sync generator 84 includes means for synchronizing the PCM bit counter 85 and the frame counter 86 so that they are in effect phase-locked at the frame rate.

For the sake of illustration, the synchronizer 84 is shown for a simplified system in which the encoded data includes data for only a single audio channel and in which a 32-bit frame synchronization code is appended to the data frame format of FIG. 5. Due to this simplification, the ratio of the PCM bit rate to the encoded data rate (including the 32-bit frame synchronization code) is 256/192 or a ratio of 4/3. Therefore, the frame counter 86 is synchronized to the PCM bit counter 85 by clocking them from a common transmitter data clock 87 oscillating at four times the encoded bit rate, and by clocking the PCM bit counter 85 by a divide-by-three counter 88, and clocking the frame counter 86 by a divide-by-four counter 89.

In order to synchronize the frame counter 86 with the PCM bit counter 85, the PCM bit counter is reset when the frame counter "rolls over". For this purpose, a delay flip-flop 90 and a NOR gate 91 are wired as a transition detector to sense the high-to-low transition of the most significant output $Q_N$ of the frame counter 86. Immediately after each transition, the NOR gate 91 generates a reset pulse which resets the PCM bit counter 85. To synchronize the transmission of frames of encoded data with the counting of the frame counter 86, there is provided a shift register 92 which is clocked in synchronism with the frame counter 86 and which receives the reset pulse from the gate 91 to perform a parallel load of a frame of data. These data include the frame sync code, which is wired into the parallel inputs 93 of the shift register, and also data from a number of latches which comprise in combination a frame buffer 94. Therefore it is necessary for the 16-bit processor 81 of the encoder to periodically store encoded data in the frame buffer 94 prior to the parallel loading of the shift register 92.

Although the encoder 80 in FIG. 6 is shown for encoding and transmitting a single channel of audio data, persons of ordinary skill in the art readily appreciate that a number of audio channels are transmitted merely by increasing the length of the shift register 92 and increasing the clocking rate of the frame counter 86 to accommodate the higher encoded data rate required for transmitting encoded data for a number of audio channels from the shift register. In such a scheme, the frame synchronization code is preferably interleaved with the encoded data for the various audio channels. In this fashion, nine stereo audio channels, along with a frame synchronization code and other housekeeping data, can be transmitted over a single video channel as described above. Moreover, in such a scheme, it is readily appreciated that the components other than the sync generator 84 and the shift register 92 are merely duplicated for each audio channel in such a multi audio channel system.

The frame buffer 94 corresponds to the data frame format of FIG. 5. Specifically, there is provided a 16-bit latch for receiving the 5 bits of error correction code, the 3 bits of the block exponent, and the 8 bits of the block offset K. There is also provided sixteen 9-bit latches generally designated 96 for receiving the 144 bits of the block data.

For interfacing the numerical processor 81 to the frame buffer 94, the sync generator 84 and the ADC 82 and DSP 83, there are provided interface logic circuits generally designated 97. The DSP 83 is connected to a bidirectional data bus 98 via a 16-bit latch 99. The latch 98 is clocked at the PCM word rate indicated by the output $Q_4$ of the PCM bit counter 85. The numerical processor 81 is interrupted at this rate via an interrupt line 100 to periodically process the 16 bit PCM value received in the latch 99.

In order to synchronize the numerical processor to the frame rate of the sync generator 84, the outputs $Q_8$–$Q_5$, defining a pointer value POINT ranging from 0 to 15, are fed to the data bus 98 through a tri-state buffer 101. The buffer is configured so that the outputs $Q_8$–$Q_5$ are fed to the data inputs $D_3$–$D_0$ of the numerical processor 81, and so that zeros are fed to the more significant bit inputs $D_{15}$–$D_4$. Therefore, the numerical processor 81 may read a pointer value POINT as a 16-bit number ranging in value from 0 to 15. As will be described below, the pointer value is used as an index to reference circular buffers, as well as to indicate the beginning and ending of the loading of the frame buffer 94 for each frame.

So that the numerical processor 81 may request the input of a PCM sample from the latch 99 or the pointer value from the PCM bit counter 85, there are provided address decoding circuits generally designated 102 for selectively addressing and enabling the tri-state outputs of the latch 99 or the buffer 101. The address decoding circuits 102 include an address comparator 103 for detecting a pre-programmed high address, and respective NAND gates 104, 105 which are strobed by the address comparator 103, a certain low order address line, and a valid memory address signal (VMA) and a read-write signal (R/W) from the numerical processor 81.

In a similar fashion, the address decoding circuits 102 include circuits for strobing a selected latch in the frame buffer 94. The latches 96 are addressable as an array, with the four lowest order address bits A3–A0 being applied to a four-bit input, 16-line output decoder 106. The decoder is selectively strobed by a NAND gate 107 responsive to a certain address line, the output of the address comparator 103, and an inverter 108 which inverts the read-write signal from the numerical processor 81. In a similar manner, the 16-bit latch 95 is selectively enabled by a NAND gate 109.

It should be noted that certain truncation and translation operations are automatically performed due to the fact that only certain ones of the data lines on the data bus 98 are received by the data inputs to the latches and the frame buffer 94. In particular, each one of the latches 96 has its upper eight data input lines tied to the most significant inputs $D_{15}$–$D_9$ of the numerical processor 81. The least significant or ninth data input lines of the latches 96 receive the output of a parity generator 110, for example, a standard TTL integrated circuit part number 74180. In a similar manner, code generator logic 111, such as a read-only memory or preferably a programmable logic array, is used to generate the error correction code from the exponent EXP and the common offset value K transmitted by the numerical processor 81 to the latch 95. In order to simplify the transmission of the exponent EXP and the common offset value K, the exponent is transmitted along the least significant data lines $D_2$–$D_0$, and the exponent is transmitted over the most significant lines $D_{15}$–$D_8$.

As shown in FIG. 6, the numerical processor 81 uses a PCM buffer 112 and a normalized value buffer 113 during the encoding process. In general terms, the individual PCM samples from the latch 99 are processed sequentially in a pipeline fashion by transfer from the latch 99 to the PCM buffer 112 for a first frame, and from the PCM buffer 112 to the frame buffer 94 during the following second frame. During the transfer from the latch 99 to the PCM buffer 112, the minimum and maximum values are found in order to determine the common offset value K and the exponent EXP. The common offset value K is used to adjust the data and the exponent EXP is used to translate the data as the data are transferred from the PCM buffer 112 to the frame buffer 94.

Figure 7A:
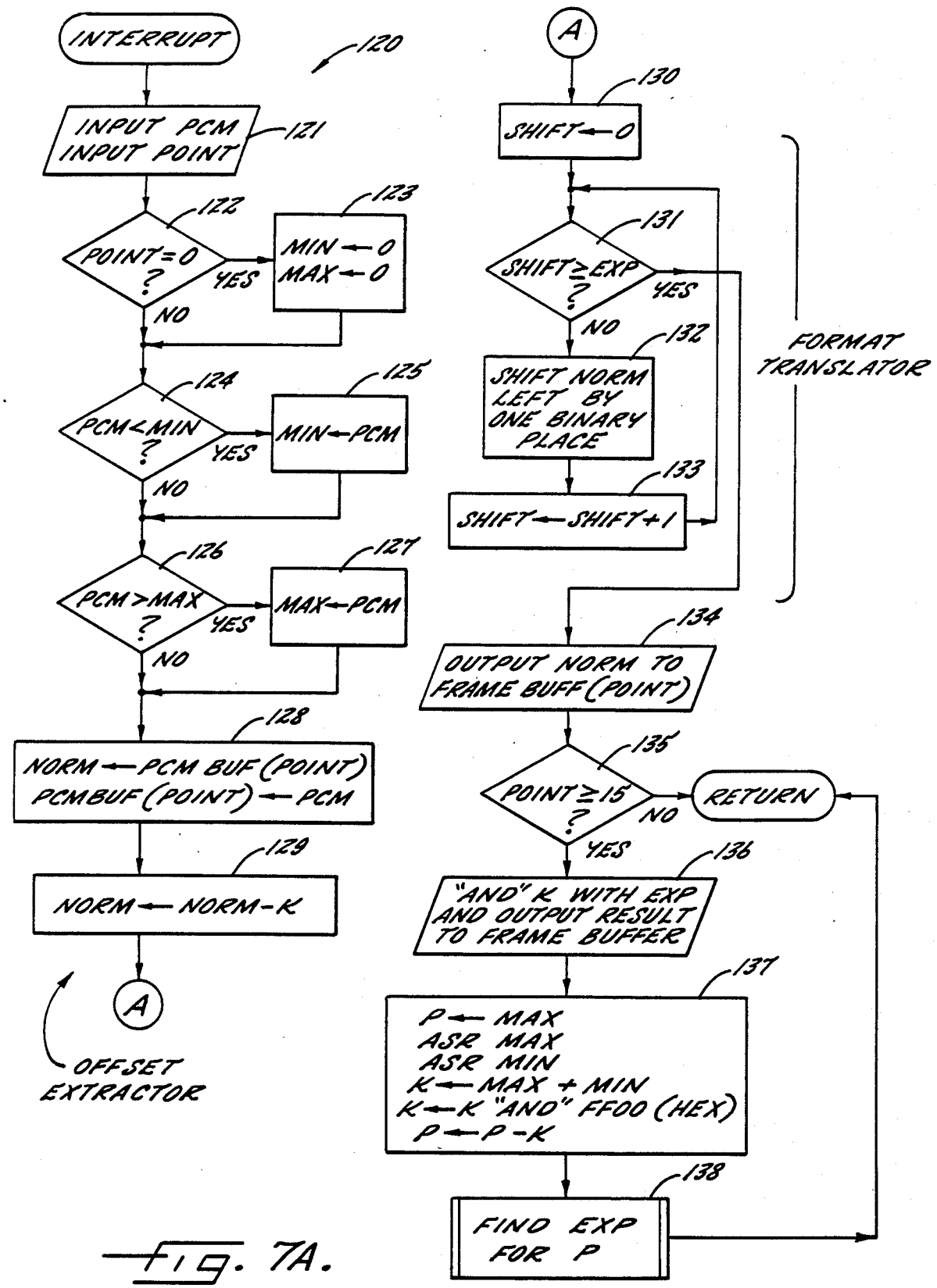
FIGS. 7A and 7B comprise a flowchart of the procedure executed by the numerical processor of FIG. 6.

Turning now to FIG. 7A, there is shown a flowchart generally designated 120 of a specific procedure for execution by the numerical processor 81 to perform the encoding process. This procedure is executed in response to the interrupt signal (from line 100 in FIG. 6) which signals that the latch 99 receives a new PCM value representing an audio sample.

In the first step 121 of the encoding procedure, the PCM value is read from the latch 99, and also the pointer value POINT is read from the PCM bit counter 85. In order to test for the start of a new frame of encoded data, the pointer POINT is compared to zero in step 122. If POINT is zero, a few initialization functions are performed in step 123. Specifically, in step 123 memory locations MIN and MAX are set to Zero. (For maximum computing speed, it is also desirable to perform step 138 in step 123 instead of at the end of the procedure.)

In order to find the PCM sample in the frame having the minimum value, in step 124 the current PCM value is compared to the value MIN. If the PCM value is smaller, then in step 125 MIN is set to the value of the PCM sample. Similarly, to find the maximum PCM value in the frame, in step 126 the PCM value is compared to the value MAX. If the PCM value is larger, then in step 127 the value MAX is set equal to the value of the PCM sample. In step 128, the PCM sample is stored in the PCM buffer at the memory location indicated by the pointer POINT. Before storage, however, the pre-existing value at that location is read out and stored in a register NORM.

For adjusting the data from the PCM buffer 112, in step 129 the common offset value K is subtracted from the value of NORM to obtain a centered value.

In order to perform a format translation operation upon the value NORM a number of left-shift operations are performed as indicated by the exponent magnitude previously determined (in step 138) for the corresponding frame. The exponent magnitude corresponding to the frame for the value NORM is found in the memory location EXP. To selectively perform the shift operations, the number of shifts is indicated by the value of a memory location SHIFT.

The format translation operation begins in step 130 by setting the value of SHIFT to zero. Then, in step 131, the value of SHIFT is compared to the value of EXP. When they become equal, the shift operation has been completed. Otherwise, in step 132, the value of NORM is shifted left by one binary place, and the shift is indicated by incrementing the value of SHIFT by one in step 133. Execution then jumps back to step 131 to continue shifting until the required number of shifts have been performed. Then, in step 134, the translated value of NORM is transmitted to the frame buffer and specifically to the latch indicated by the value of POINT.

Execution of the encoding procedure is completed for the current interrupt cycle, unless all of the latches 96 have been filled with new data. This condition is tested in step 135 by comparing the value of POINT to 15. Once the value of POINT reaches 15, then encoding for the current frame is completed in step 136 by performing a logical AND between the value of K and EXP, and outputting the result to the 16-bit latch (95 in FIG. 6) of the frame buffer. After this is done, a number of data transfers and computations are performed in step 170 to set up values corresponding to data stored in the PCM buffer (112 in FIG. 6). Specifically, the value of the newly computed maximum MAX is stored at a location P. Then a new value of the common offset is computed by arithmetically shifting right both MAX and MIN by one binary place, and adding the shifted values together to calculate a median or arithmetic mean value which is stored in the memory location K. The lower eight bits of the median value are truncated by performing a logical AND of the mean value with a value of FF00 (HEX). Then, the value of P is decreased by the value of K to determine the centered maximum value for the frame of data in the PCM buffer. Since K was truncated, the value of P is also the centered value having the maximum magnitude. Therefore, in step 138, the exponent is determined based on the value of P.

In general, the exponent for representing a value in floating point is related to the range which includes the value as shown in Table I below:

TABLE I

| EXPONENT EXTRACTION | |
|---|---|
| RANGE (HEX) | EXPONENT (MAGNITUDE) |
| 4000–7FFF | 0 |
| 2000–3FFF | 1 |
| 1000–1FFF | 2 |
| 0800–0FFF | 3 |
| 0400–07FF | 4 |
| 0200–03FF | 5 |
| 0100–01FF | 6 |
| FF00–00FF | 7 |
| FE00–FEFF | 6 |
| FC00–FDFF | 5 |
| F800–FBFF | 4 |
| F000–F7FF | 3 |
| E000–EFFF | 2 |
| C000–DFFF | 1 |
| 8000–BFFF | 0 |

Figure 7B:
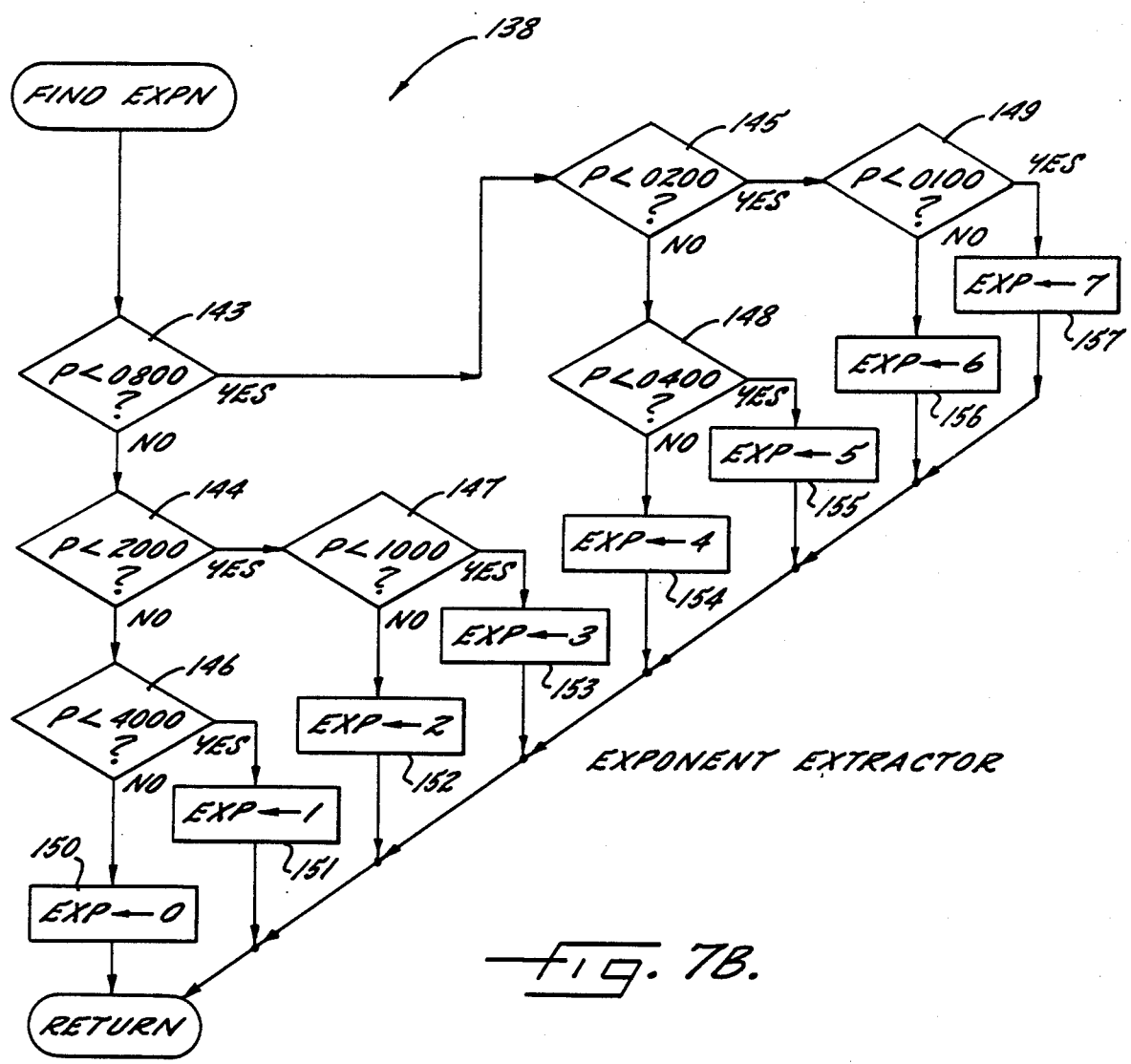

Turning now the FIG. 7B, there is shown a detailed portion of the flowchart for the step 138 in FIG. 7A. The exponent for the positive value P is found by searching through a binary decision tree which results in the selection of a particular one of the eight possible exponent values. Specifically, in step 143 the value is compared to 0800 (HEX) to split the range of positive values into halves, to 2000 (HEX) in step 144 and 0200 (HEX) in step 145 to break the halves in quarters, and finally to 4000 (HEX) in step 146, to 1000 (HEX) in step 147, to 0400 (HEX) in step 148, and to 0100 (HEX) in step 149 to select a particular one of the eight positive ranges corresponding to exponent magnitudes from 0 to 7. The particular value of the exponent magnitude is assigned to the memory location EXP in a particular one of steps 150 to 157.

At this point the entire current frame has been encoded, and values have been set up for further encoding of the next frame based on data stored in the PCM buffer (112 in FIG. 6).

Figure 8:
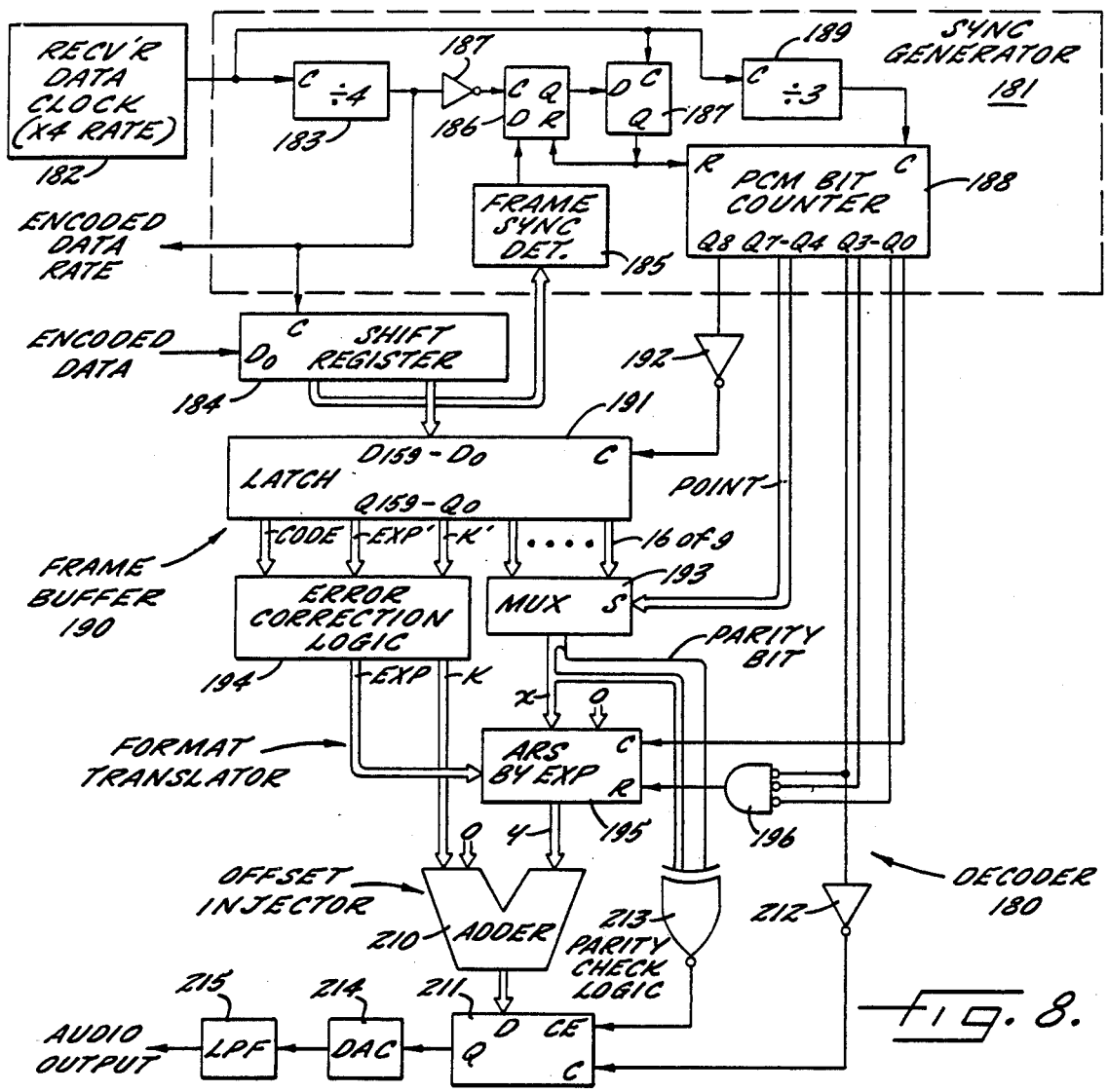
FIG. 8 is a schematic diagram of a specific embodiment of a decoder according to the invention.

Turning now to FIG. 8, there is shown a schematic diagram of a decoder generally designated 180 for receiving and decoding data from the encoder 80 of FIG. 6. It should be apparent that the decoding process is very easily performed in comparison to the encoding process. In particular, the numerical operations are very easily performed by hard-wired logic.

The decoder has a sync generator 181 for synchronizing the audio sample or PCM rate to the rate of the encoded data. The sync generator 181 operates at a master frequency set by a receiver data clock 182 operating at four times the encoded data rate. In particular, the receiver data clock 182 is a voltage-controlled oscillator in a conventional data clock recovery circuit (for example, in the tuner and demodulator 52 of FIG. 3). Such a data clock recovery circuit phase locks the receiver data clock 182 to the logic transitions in the encoded data. The sync generator 181 includes a divide by four counter to provide a signal at the encoded data rate which is used to clock a shift register 184 to receive the encoded data. In order to synchronize the sync generator 181 to the frame rate in the encoded data, there is provided a frame sync detector 185 which correlates data in the shift register with the predetermined 32 bit frame sync code. The frame sync code is a bit pattern such as ACF0FF00 (HEX) which has a sharp autocorrelation peak. When the frame sync detector detects such a correlation or match between the pre-stored frame sync code and what is found in the shift register 184, a frame sync pulse is generated and sent to a delay flip-flop 186 which is clocked at four times the encoded data rate through an inverter 187. In order to generate a frame synchronizing reset pulse, the output Q of the flip-flop 186 is fed to a second delay flip-flop 187 clocked at four times the data rate. The Q output of the second flip-flop 187 is fed back to the reset input of the first flip-flop 186 in order to generate a narrow reset pulse.

To provide signals at the frame rate and at the PCM sample rate in order to carry out the decoding process, the sync generator 181 includes a PCM bit counter 188 which is clocked at the PCM bit rate and which is reset by the reset pulse from the second delay flip-flop 187. The signal from the receiver data clock 182 is passed through a divide-by-three counter 189 in order to clock the PCM bit counter 188 at the PCM bit rate.

The most significant output $Q_8$ of the PCM bit counter 188 indicates the receipt of an entire frame of encoded data into the shift register 184. In order to hold the data according to the frame format of FIG. 5, there is provided a frame buffer 190 in the form of a 160-bit latch which is clocked in response to the $Q_8$ output of the PCM bit counter 188. An inverter 192 assures that the latch is clocked to receive data from the shift register when the PCM bit counter "rolls over" to zero.

To obtain the proper nine bits of floating-point representation and parity for the current audio sample indicated by the PCM bit counter 188, there is provided a multiplexer 193 which selects the particular nine bits indicated by the outputs $Q_4$–$Q_7$ of the PCM bit counter 188. To obtain the common exponent EXP and the common offset K for the current frame, error correction logic 194 processes the upper 16 bits from the latch 191 to obtain an error corrected exponent EXP and block offset K. The error correction logic 194 is provided, for example, by a programmed logic array.

In order to provide format translation, the upper eight bits from the multiplexer 183 are arithmetically right-shifted by the g35number of times indicated by the block exponent EXP. For this purpose, there is provided an arithmetic right-shift circuit 195 which is clocked at twice the PCM bit rate specified by $Q_0$ of the PCM bit counter 188. The arithmetic right-shift circuit 195 is reset by a NOR gate 196 at the start of each PCM sample interval when outputs $Q_1$, $Q_2$ and $Q_3$ of the PCM bit counter are all logic zeros.

Figure 9:
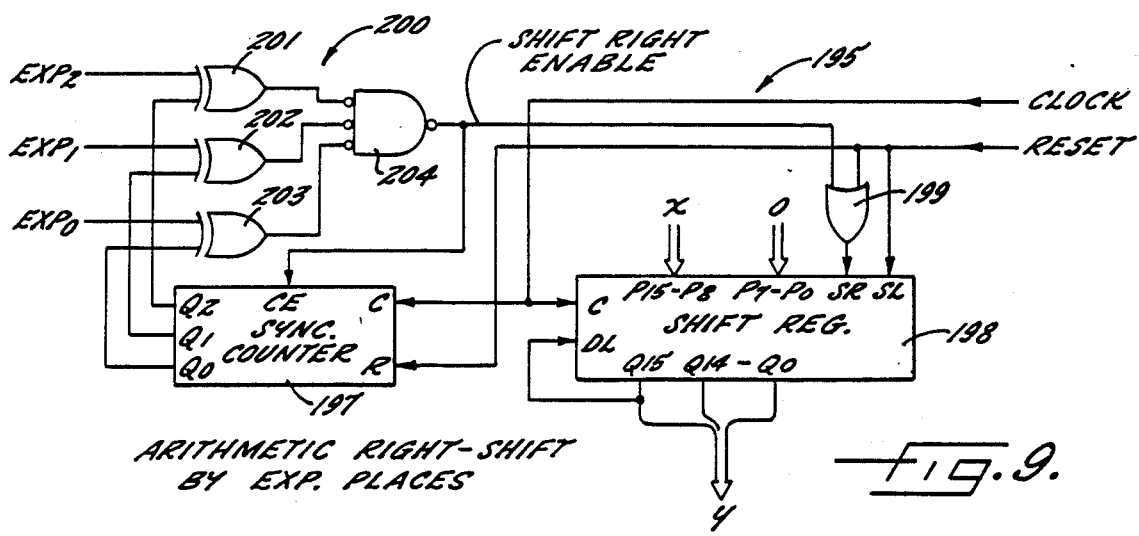
FIG. 9 is a schematic diagram of a shift register used by the decoder of FIG. 8 for format translation.

Turning for the moment to FIG. 9, there is shown a detailed schematic drawing of the arithmetic right-shift circuit generally designated 195. A fully synchronous counter 197 (such as a standard TTL part number 74163) is provided to indicate the number of times that a shift register 198 (such as two standard TTL part numbers 74194) has been shifted after being loaded with data values X and zero values. The values X are received from the multiplexer 193 in FIG. 8, and are received as the most significant eight input bits $P_{15}$–$P_8$ of the shift register 198. Upon the occurrence of a positive-going clock transition When the reset signal is a logic high, the synchronous counter 197 is reset and the data values are loaded into the shift register 198. For this purpose the synchronous counter 197 and shift register 198 are clocked by the common clock signal, and the reset line is fed to the reset input of the synchronous counter 197, the shift left input of the shift register 198, and also, through NOR gate 199, to the shift right input of the shift register. It should be apparent, then, that the shift register 198 is of the kind which performs a parallel load upon the occurrence of a clock transition when both its shift-left and shift-right inputs are at a logic high.

So that the shift register will provide an arithmetic shift right, its most significant output $Q_{15}$ is fed to its left serial data input (DL). Also, a shift-right enable signal is fed to the OR gate 199.

So that the shift register will perform only the number of right-shifts indicated by the value of the EXP, there is provided a numerical comparitor generally designated 200 which compares the outputs $Q_2$–$Q_0$ of the synchronous counter 197 to the value of the exponent. As is conventional, the numerical comparitor 200 includes exclusive-OR gates 201, 202, 203 and a NOR gate 204. The shift-right enable signal is therefore a logic high until the output of the synchronous counter 197 becomes equal in value to the exponent. Moreover, the shift-right enable output of the gate 204 is fed back to a clock enable (CE) input of the synchronous counter 197 to inhibit the synchronous counter 197 from counting further. Therefore, the shift register 198 performs a number of arithmetic shift-right operations specified by the exponent value, and then stops shifting.

Returning now to FIG. 8, the translated output Y of the arithmetic right-shift circuit 195 provides a format translated value for the decoding operation. In order to inject the offset K, there is provided a binary adder 210 which computes the sum of the offset K (in the most significant eight of 16 bit positions), to the 16 bit value Y. The sum, therefore, represents the decoded PCM value. In order to hold this value steady for digital-to-analog conversion, the output of the adder 210 is received in a 16-bit latch 211. So that the latch receives the data at the end of each PCM sample interval, the latch 211 is clocked by an inverter 212 receiving the $Q_3$ output of PCM bit counter 188.

In order to inhibit clocking ⓒf the latch 211 when there is a parity error, the nine bits from the multiplexer 193, including the parity bit, are fed to parity check logic 213 (such as standard TTL part number 74180). The output of the parity check logic enables the latch 211 in such a way that the latch is inhibited when a parity error occurs. In this fashion, each erroneous sample is replaced with the preceeding sample for which a parity error did not occur.

To reconstruct the encoded audio signal, the output of the latch 211 is converted to an analog signal by a digital-to-analog converter (DAC) 214, and the resulting analog signal is fed through a low pass filter 215 to remove high frequency components above the audio sampling rate, and to restore the high end of the audio spectrum from the effects of sampling.

From the above, it is apparent that the invention provides an improved audio transmission system which is especially adapted for transmitting digitally encoded stereo audio signals over a conventional cable television channel. The decoder, in particular, is easily fabricated from hard-wired digital logic and is therefore suitable for mass production as a custom integrated circuit. Although the encoder is more complex in comparison to the decoder, only a few encoders need be produced for each cable television system having a multitude of subscribers. An economical decoder, therefore, insures that the digital audio transmission system of the present invention is economical to implement. Moreover, due to the data rate compression of the present invention, such a system can provide for the transmission of an increased number of audio channels over a single video channel. Since the audio is transmitted in a digital form and the encoding process of the present invention insures a wide dynamic range and a flat frequency response, the reception of a high fidelity audio signal is assured. The encoding and decoding methods and apparatus of the present invention, therefore, are also suitable for the recording as well as the transmission of high-fidelity audio signals. The present invention, for example, could also be useful for recording compressed digital audio signals on magnetic tape, since the data rate compression provided by the invention would enable such digital recording to be performed at lower tape speeds and would permit an increased amount of program material to be recorded on a tape of a given length. Similarly, a greater amount of program material in the compressed format of the invention could be stored on a magnetic or optical disc.

I hereby claim:

1. A method for digitally encoding an audio signal represented by an initial series of pulse-code modulated (PCM) data values occurring at a first rate, said audio signal including low frequency components of high amplitude and high frequency components of relatively low amplitude, said method comprising the steps of:
   (a) extracting from said PCM data values a series of representative values occurring at a second rate substantially lower than said first rate, half of said second rate being at an intermediate frequency in the audio spectrum,
   (b) offsetting said PCM data values in accordance with corresponding values in said series of representative values to obtain a series of adjusted PCM data values, and
   (c) converting the adjusted PCM data values to a series of floating-point data values by extracting exponents, so that the combination of said series of representative values and said series of floating-point data values encode said audio signal at a substantially lower data rate than said initial series of PCM data values, and thereby preventing the low frequency components of high amplitude from having a destructive effect upon the high frequency components of relatively low amplitude.

2. The method as claimed in claim 1, wherein said step (a) of extracting is performed by grouping a predetermined number of consecutive PCM data values into blocks, and computing a respective one of said representative values from the PCM data values in each block, so that said predetermined number is the ratio of said first and second rates.

3. The method as claimed in claim 2, wherein the representative value for each block is computed by selecting the maximum and minimum PCM data values in the block, and calculating said representative value as the mean value of said maximum and minimum values.

4. The method as claimed in claim 2, wherein said PCM data values are offset by subtracting from them corresponding values in said series of representative values.

5. The method as claimed in claim 1, wherein said half of said second rate is approximately one kilohertz.

6. A decoder for decoding an audio signal having been represented by an initial series of pulse-code modulated (PCM) data values occurring at a first rate, said audio signal including low frequency components of high amplitude and high frequency components of relatively low amplitude, said audio signal having been encoded by: (a) extracting from said PCM data a series of representative values occurring at a second rate substantially lower than said first rate, half of said second rate being at an intermediate frequency in the audio spectrum, said intermediate frequency lying between the frequencies of said low frequency components and said high frequency components; (b) offsetting said PCM values in accordance with corresponding values in said series of representative values to obtain a series of adjusted PCM data values; (c) extracting a series of scale factors from said series of adjusted PCM data values, said scale factors occurring at a rate substantially less than said first rate, said series of scale factors being selected in accordance with the magnitudes of said adjusted PCM data values; and (d) scaling said adjusted PCM data values by corresponding ones of said scale factors, to obtain a scaled series of PCM data values, so that the combination of said series of representative values, said series of scale factors and said scaled series of PCM data values encode said audio signal at a substantially lower data rate than said initial series of PCM data values; said decoder comprising:
   (a) means for receiving said series of representative values, said series of scale factors, and said series of PCM data values;
   (b) means for translating the scaled PCM data values in accordance with said scale factors to obtain a series of translated PCM data values; and
   (h) means for combining corresponding ones of said representative values with said translated PCM data values to obtain a series of PCM data values approximating said initial data values, and thereby preventing the low frequency components of high amplitude from having a destructive effect upon the high frequency components of relatively low amplitude.

7. The method as claimed in claim 2, wherein said first predetermined rate is approximately 36 kilohertz to accommodate an audio bandwidth of a 18 kilohertz, and said predetermined number of consecutive PCM data values is about 16.

8. The method as claimed in claim 1, further comprising the step of transmitting the floating-point data values along with said series of representative values over a video-bandwidth channel to a remote location where an audio signal is decoded from the transmitted series of values.

9. A method of decoding an audio signal which has been digitally encoded from an initial series of pulse-code modulated (PCM) data values occurring at a first rate, said audio signal including low frequency components of high amplitude and high frequency components of relatively low amplitude, said method including the steps of:
   (a) extracting from said PCM data values a series of representative values occurring at a second rate substantially lower than said first rate, half of said second rate being at an intermediate frequency in the audio spectrum, (b) offsetting said PCM data values in accordance with corresponding values in said series of representative values to obtain a series of adjusted PCM data values, and (c) converting the adjusted PCM data values to a series of floating-point data values by extracting exponents, so that the combination of said series of representative values and said series of floating-point data values encode said audio signal at a substantially lower-data rate than said initial series of PCM data values, said method of decoding comprising the steps of:

(d) translating the series of floating-point data values to obtain a series of fixed-point data values, and (e) combining corresponding ones of said representative values with said fixed-point data values to obtain a series of PCM data values approximately said initial series, and thereby preventing the low frequency components of high amplitude from having a destructive effect upon the high frequency components of relatively low amplitude.

10. The method as claimed in claim 7, wherein said half of said second rate is approximately one kilohertz.

11. The method as claimed in claim 10, wherein said step (e) of combining includes the operation of adding said representative values to said fixed-point data values.

12. The method as claimed in claim 11, where said operation of adding is performed by adding each representative value to each of a predetermined number of consecutive fixed-point data values.

13. The method as claimed in claim 12, wherein said first rate is approximately 36 kilohertz to accommodate an audio bandwidth of about 18 kilohertz, and said predetermined number of consecutive adjusted PCM data values is 16.

14. A method for digitally encoding an audio signal represented by an initial series of fixed-point pulse code modulate (PCM) data values occurring at a predetermined sampling rate, each value being represented by a predetermined number of bits, said audio signal including low frequency components of high amplitude and high frequency components of relatively low amplitude, said method comprising the steps of:

dividing said series of fixed-point PCM data values into blocks, each block comprising a plurality of consecutive PCM data values, each block including a predetermined number of said consecutive PCM data values so that said blocks occur at a determined block rate being less than said sampling rate, half of said block rate being at an intermediate frequency in the audio spectrum, centering the fixed-point PCM data values within each block about a zero reference level by extracting a common offset value K for the data values within the block, selecting for each block a respective one of a plurality of predetermined scale factors, the respective scale factor for each block being selected in accordance with the centered fixed-point PCM data value of maximum magnitude in the block, scaling the centered fixed-point PCM data values in each block by the respective scale factor selected for the block to obtain a series of scaled PCM data values that are represented by a predetermined number of bits less than the number of bits of the PCM data values in the initial series, so that the combination of the series of floating-point PCM data values, the common offsets K for the blocks, and the common scale factors for the blocks encode said audio signal at a substantially lower bit rate than said initial series of fixed-point PCM data values, and thereby preventing the low frequency components of high amplitude from having a destructive effect upon the high frequency components of relatively low amplitude.

15. The method of claim 14, wherein said half of said block rate is approximately one kilohertz.

16. The method of claim 14, wherein the offset value K is determined as the median value between the minimum and maximum data values within each block.

17. The method as claimed in claim 12, wherein said conversion of the companded PCM data values from floating-point representative to fixed-point representation is performed by arithmetically right-shifting each of said predetermined number of consecutive ones of said floating-point data values by a selected number of binary places.

18. A method for digitally encoding an audio signal represented by an initial series of fixed-point pulse code modulated (PCM) data values occurring at a predetermined sampling rate, each value being represented by a predetermined number of bits, said audio signal including low frequency components of high amplitude and high frequency components of relatively low amplitude, said method comprising the steps of:

dividing said series of fixed-point PCM data values into blocks, each block comprising a plurality of consecutive PCM data values, each block including a predetermined number of said consecutive PCM data values so that said blocks occur at a predetermined block rate being less than said sampling rate, half of said block rate being at an intermediate frequency in the audio spectrum, centering the fixed-point PCM data values within each block about a zero reference level by extracting a common offset value K for the data values within the block, transforming the centered fixed-point PCM data values within each block to a floating-point format in which the centered PCM data values are represented by a predetermined number of bits less than the number of bits of the PCM data values in said initial series, and in which a common exponent is determined for the block corresponding to a common scale factor for the floating-point conversion, so that the combination of the series of floating-point PCM data values, the common offsets K for the blocks, and the common exponents for the blocks encode said audio signal at a substantially lower bit rate than said initial series of fixed-point PCM data values, and thereby preventing the low frequency components of high amplitude from having a destructive effect upon the high frequency components of relatively low amplitude.

19. The method of claim 18 wherein each of the blocks consist of 16 PCM data values.

20. The method of claim 18 wherein said offset value K is determined as the median value between the minimum and maximum data values within each block.

21. The method of claim 18 wherein said predetermined rate is about 36 kilohertz to accommodate an audio bandwidth of about 18 kilohertz.

22. The method of claim 18 further comprising the step of transmitting, for each block, the common offset value K, the common exponent, and the floating-point PCM values, said transmission being performed over a video channel to a plurality of decoders.

23. The method as claimed in claim 22 wherein said video channel is one of a number of channels in a conventional cable television network transmitting a standard chrominance component, and said predetermined sampling rate is 37.879 KHz so as to be most compatible with said chrominance component.

24. The method as claimed in claim 18, further comprising the steps of truncating the common offsets K to 8 bits, truncating the common exponents to 3 bits, and truncating the floating-point PCM values to 8 bits.

25. The method as claimed in claim 24, further comprising the step of transmitting the truncated values to at least one decoder.

26. The method as claimed in claim 24 wherein said predetermined number of bits for representing each initial fixed-point PCM data value is 16.

27. The method as claimed in claim 18, wherein said half of said block rate is approximately one kilohertz.

28. A method for decoding an audio signal which has been encoded from an initial series of fixed-point pulse code modulated (PCM) data values occurring at a predetermined sampling rate and representing samples of said audio signal, each value being represented by predetermined number of bits, said audio signal including low frequency components of high amplitude and high frequency components of relatively low amplitude, said audio signal having been encoded by:
dividing said series of fixed-point PCM data values into blocks, each block comprising a plurality of consecutive PCM data values, each block including a predetermined number of said consecutive PCM data values so that said blocks occur at a predetermined block rate being less than said sampling rate, half of said block rate being at an intermediate frequency in the audio spectrum,
centering the fixed-point PCM data values within each block about a zero reference level by extracting a common offset value K for the data values within the block, and
transforming the centered fixed-point PCM data values within each block to a floating-point format in which the centered PCM data values are represented by a predetermined number of bits less than the number of bits of the PCM data values in said initial series, and in which a common exponent is determined for the block corresponding to a common scale factor for the floating-point conversion, so that the combination of the series of floating-point PCM data values, the common offsets K for the blocks, and the common exponents for the blocks encode said audio signal at a substantially lower bit rate than said initial series of fixed-point PCM data values,
said method of decoding comprising the steps of:
receiving said common offset values K, said common exponent values, and said floating-point PCM data values,
transforming the received floating-point PCM data values in accordance with their respective received exponent values to recover fixed-point PCM data values,
de-centering the fixed-point PCM data values by adding to them their respective common offset values, and
converting the de-centered fixed-point PCM data values to analog form, thereby preventing the low frequency components of high amplitude from having a destructive effect upon the high frequency components of relatively low amplitude.

29. The method as claimed in claim 28, wherein each of the blocks consists of 16 PCM data values.

30. The method as claimed in claim 28, wherein said step of receiving receives 8-bit common offset values K, 3-bit common exponent values, and 8-bit floating-point PCM data values.

31. The method as claimed in claim 30 wherein said predetermined sampling rate is approximately 36 KHz to provide an audio bandwidth of about 18 KHz, and wherein the de-centered fixed-point PCM data values converted to analog form are each represented by 16 bits to reproduce said audio signal with high fidelity.

32. The method as claimed in claim 28, wherein said half of said block rate is approximately one kilohertz.

33. A decoder for decoding an audio signal which has been encoded from an initial series of fixed-point pulse code modulated (PCM) data values occurring at a predetermined sampling rate and representing samples of said audio signal, each value being represented by a predetermined number of bits, said audio signal including low frequency components of high amplitude and high frequency components of relatively low amplitude, said audio signal having been encoded by:
dividing said series of fixed-point PCM data values into blocks, each block comprising a plurality of consecutive PCM data values, each block including a predetermined number of said consecutive PCM data values so that said blocks occur at a predetermined block rate being less than said sampling rate, half of said block rate being at an intermediate frequency in the audio spectrum,
centering the fixed-point PCM data values within each block about a zero reference level by extracting a common offset value K for the data values within the block, and
transforming the centered fixed-point PCM data values within each block to a floating-point format in which the centered PCM data values are represented by a predetermined number of bits less than the number of bits of the centered PCM data values, and in which a common exponent is determined for the block corresponding to a common scale factor for the floating-point conversion, so that the combination of the series of floating-point PCM data values, the common offsets K for the blocks, and the common exponents for the blocks encode said analog audio signal at a substantially lower bit rate than said initial series of fixed-point PCM data values, and thereby limiting the normally destructive effect that the low frequency components of high amplitude have upon the high frequency components of low amplitude,
said decoder comprising, in combination,
means for receiving said common offset values K, said common exponent values, and the floating-point PCM data values,
means for transforming the received floating-point PCM data values in accordance with their respective received exponent values to recover fixed-point PCM data values, means for de-centering the fixed-point PCM data values by adding their respective common offset values, and means for converting the de-centered fixed-point PCM data values to analog form.

34. The decoder as claimed in claim 33, wherein said means for receiving includes means for receiving encoded data blocks consisting of 16 PCM data values, and a common exponent and offset value K for each block.

35. The decoder as claimed in claim 33, wherein said means for receiving includes means for receiving 8-bit common offset values K, a 3-bit common exponent values, and 8-bit floating-point PCM data values.

36. The decoder as claimed in claim 33, wherein said means for transforming includes a shift register for performing an arithmetic right-shift by a selected number of binary places indicated by the exponent values.

37. The decoder as claimed in claim 33, wherein said predetermined sampling rate is approximately 36 KHz to provide an audio bandwidth of about 18 KHz, the de-centered fixed-point PCM data values converted to analog form are each represented by 16 bits, and said means for converting the de-centered fixed-point PCM data values comprises a 16-bit digital-to-analog converter to reproduce said audio signal with high fidelity.

38. The decoder as claimed in claim 33, wherein said means for receiving further comprises a cable television tuner and demodulator.

39. The decoder as claimed in claim 33, wherein said decoder consists essentially of hard-wired digital logic.

40. The decoder as claimed in claim 33, wherein said half of said block rate is approximately one kilohertz.

41. A method of digitally encoding, transmitting, and decoding an audio signal represented by an initial series of pulse-code modulated (PCM) data values occurring at a first rate, said audio signal including low frequency components of high amplitude and high frequency components of relatively low amplitude, said method comprising the steps of:

(a) extracting from said PCM data a series of representative values occurring at a second rate substantially lower than said first rate, half of said second rate being at an intermediate frequency in the audio spectrum, said intermediate frequency lying between the frequencies of said low frequency components and said high frequency components, (b) offsetting said PCM values in accordance with corresponding values in said series of representative values to obtain a series of adjusted PCM data values, (c) extracting a series of scale factors from said series of adjusted PCM data values, said scale factors occurring at a rate substantially less than said first rate, said series of scale factors being selected in accordance with the magnitudes of said adjusted PCM data values, (d) scaling said adjusted PCM data values by corresponding ones of said scale factors, to obtain a scaled series of PCM data values, so that the combination of said series of representative values, said series of scale factors and said scaled series of PCM data values encode said audio signal at a substantially lower data rate than said initial series of PCM data values, (e) transmitting said series of scaled PCM data values, said series of representative values and said series of scale factors over a band-limited channel, (f) receiving said series of scaled PCM values, said series of representative values and said series of scale factors from said band-limited channel, (g) translating the scaled PCM data values in accordance with said scale factors to obtain a series of translated PCM data values, and (h) combining corresponding ones of said representative values with said translated PCM data values to obtain a series of PCM data values approximately said initial series, and thereby preventing the low frequency components of high amplitude from having a destructive effect upon the high frequency components of relatively low Amplitude.

42. The method of claim 41, wherein said half of said second rate is approximately one kilohertz.

43. The method of claim 41, wherein said scale factors are exponents and said adjusted fixed-point PCM data values are scaled exponentially by said exponents.

44. The method of claim 41, wherein said step (a) of extracting the representative values is performed by grouping a predetermined number of consecutive PCM data values into blocks, and computing a respective one of said representative values from the PCM data values in each block, so that said predetermined number is the ratio of said first and second rates.

45. The method of claim 49, wherein one scale factor is extracted from each block.

46. The method as claimed in claim 44, wherein said first predetermined rate is approximately 36 kilohertz to accommodate an audio bandwidth of about 18 kilohertz, and said predetermined number of consecutive PCM data values is 16.

* * * * *